(12) United States Patent
Tsuzuki

(10) Patent No.: US 7,872,521 B2
(45) Date of Patent: Jan. 18, 2011

(54) CCD DEVICE AND METHOD OF DRIVING SAME

(75) Inventor: Takao Tsuzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 179 days.

(21) Appl. No.: 12/360,131

(22) Filed: Jan. 27, 2009

(65) Prior Publication Data

US 2009/0195297 A1  Aug. 6, 2009

(30) Foreign Application Priority Data

Jan. 31, 2008  (JP) .............................. 2008-021257

(51) Int. Cl.
*H01L 25/00* (2006.01)

(52) U.S. Cl. ............................ 327/565; 377/58; 377/59; 377/63

(58) Field of Classification Search .................. 327/284, 327/534, 535, 537, 564–566; 377/57–63
See application file for complete search history.

(56) References Cited

U.S. PATENT DOCUMENTS

| 4,683,580 | A | * | 7/1987 | Matsunaga | 377/60 |
| 5,150,388 | A | * | 9/1992 | Harada et al. | 377/60 |
| 5,199,053 | A |   | 3/1993 | Hirama |  |
| 5,247,554 | A | * | 9/1993 | Yamada | 377/60 |
| 5,524,036 | A | * | 6/1996 | Miwada | 377/63 |
| 5,615,242 | A | * | 3/1997 | Hirota | 377/60 |

\* cited by examiner

*Primary Examiner*—Lincoln Donovan
*Assistant Examiner*—William Hernandez
(74) *Attorney, Agent, or Firm*—Young & Thompson

(57) ABSTRACT

Disclosed is a CCD device in which a charge transfer register of a CCD structure is connected to a charge detector via an output gate and has a reset gate between the charge detector and a reset drain, and an output gate pulse opposite in phase from a reset pulse applied to the reset gate is applied to the output gate. A dummy charge detector and an amplitude adjusting circuit are provided. On the basis of detection of the potential of a diffusion layer in the dummy charge detector, the amplitude adjusting circuit controls the amplitude of the output gate pulse applied to the output gate.

9 Claims, 7 Drawing Sheets

1a: FIRST POLYSILICON GATE, 1b: SECOND POLYSILICON GATE, 2: OUTPUT GATE,
3: CHARGE DETECTOR, 4: RESET GATE, 5: RESET DRAIN, 6: OUTPUT CIRCUIT,
7: DUMMY CHARGE DETECTOR, 8: ΦOG PULSE GAIN ADJUSTING CIRCUIT

2: OUTPUT GATE, 3: CHARGE DETECTOR, 4: RESET GATE, 5: RESET DRAIN

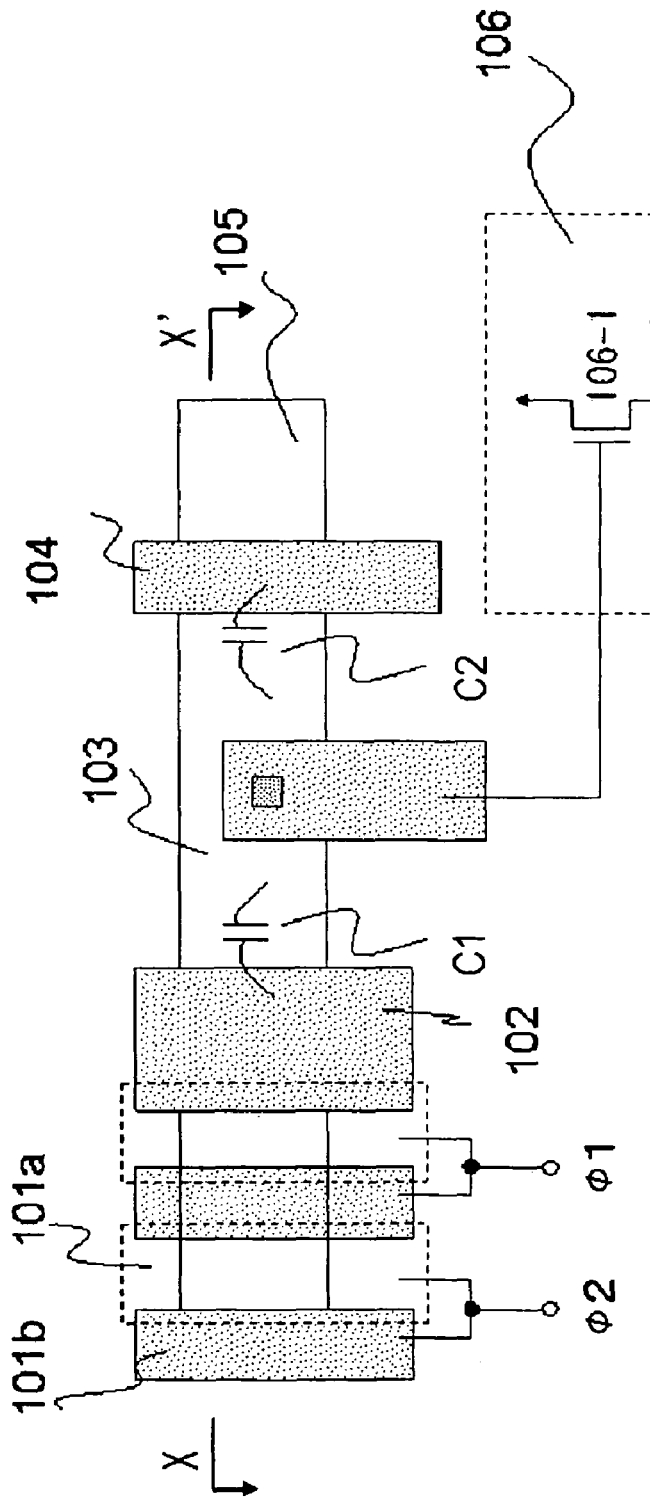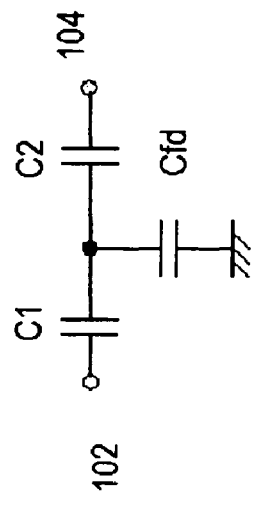

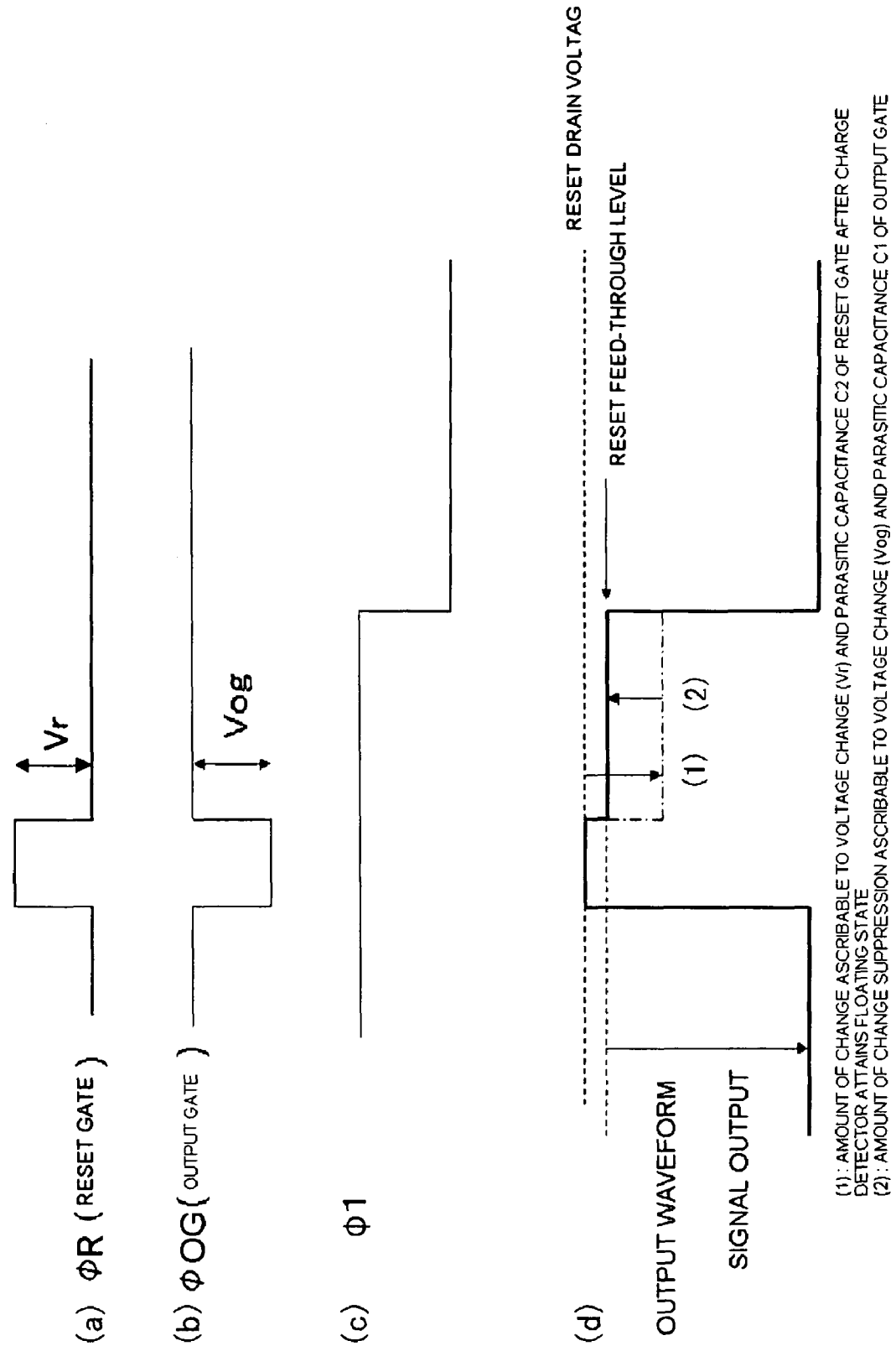

US 7,872,521 B2

CCD DEVICE AND METHOD OF DRIVING SAME

REFERENCE TO RELATED APPLICATION

This application is based upon and claims the benefit of the priority of Japanese patent application No. 2008-021257, filed on Jan. 31, 2008, the disclosure of which is incorporated herein in its entirety by reference thereto.

FIELD OF THE INVENTION

This invention relates to a CCD device and to a method of driving this device. More particularly, the invention relates to a CCD device adapted to suppress reset feed-through noise produced by a charge detector of a CCD, and to a method of driving the CCD device.

DESCRIPTION OF RELATED ART

As an example of related art concerning suppression of reset feed-through noise of a CCD (Charge-Coupled Device), see the description in Patent Document 1. Specifically, Patent Document 1 discloses a CCD element in which a floating depletion region is connected to the final stage of a charge transfer register of a CCD structure, and which is provided with a reset gate between the floating depletion region and a reset drain region. By applying an output gate pulse $\phi OG$, which is opposite in phase to a reset gate pulse $\phi R$ applied to the reset gate, to a horizontal output gate portion (output gate), the influence of parasitic capacitance between the floating depletion region and the reset gate is suppressed, thereby making it possible to promote an increase in sensitivity.

A typical configuration and driving method of a CCD charge detector will be described with reference to FIGS. 4 to 6. It should be noted that FIGS. 4 to 6 have been created anew by the inventor in order to describe the background of the present invention and do not represent the content of the drawings of Patent Document 1 as is. FIG. 4A illustrates circuit connections between a layout and an output circuit, and FIG. 4B illustrates the parasitic capacitance between an output gate and a charge detector and the parasitic capacitance between a reset gate and the charge detector. FIG. 5A schematically illustrates the cross-sectional configuration taken along line X-X' in FIG. 4A, and FIG. 5B illustrates potentials (along the vertical axis) at the corresponding positions in the cross-section of FIG. 5A. FIG. 6 is a diagram illustrating timing waveforms, in which (a) illustrates a pulse (reset gate pulse) $\phi R$ applied to a reset gate 104, (b) an output gate pulse $\phi OG$ applied to an output gate 102, (c) a driving clock $\phi 1$ ($\phi 2$ represents the complementary signal of $\phi 1$), and (d) a CCD output waveform (the potential at a charge detector 103).

Shown in FIGS. 4A and 5A are first polysilicon layer 101a, second polysilicon layer 101b, the output gate 102, the charge detector 103, the reset gate 104, a reset drain (N+ region) 105 and an output circuit 106. Driving signals $\phi 1$ and $\phi 2$ of two phases transfer signal charge in the horizontal direction. The first polysilicon layer 101a and second polysilicon layer 101b driven by the two-phase driving pulses $\phi 1$ and $\phi 2$ in FIG. 4A form the final stage of a CCD shift register. The output circuit 106 comprises a source-follower buffer that receives the potential of the charge detector 103 as an input and outputs an in-phase voltage signal that follows the input potential. The output circuit 106 has a source-follower NMOSFET 106-1 and a load transistor (NMOSFET) 106-2 the gate of which is biased by a constant voltage.

With reference to FIGS. 4A and 4B, an output gate-charge detector parasitic capacitance C1 exists across the output gate 102 and one end of a charge detector capacitance Cfd, and a reset gate-charge detector parasitic capacitance C2 exists across the reset gate 104 and one end of the charge detector capacitance Cfd.

Electric charge that has been transferred successively through the CCD shift register comprising the first polysilicon layer 101a and second polysilicon layer 101b is transferred to the charge detector 103 via the output gate 102, which has been turned on by the output gate pulse $\phi OG$.

The charge that has been transferred to the charge detector 103 is converted to voltage by the charge detector capacitance Cfd and is output via the output circuit 106 [see "SIGNAL OUTPUT" at (d) in FIG. 6).

Thereafter, before the next charge is transferred, the reset gate 104 is turned on by applying the reset gate pulse $\phi R$, and the potential at the charge detector 103 is set to the potential of the reset drain 105 [see "RESET DRAIN VOLTAGE" at (d) in FIG. 6).

When the reset gate 104 changes from ON to OFF, the output gate 102 also turns off and therefore the charge detector 103 is in a floating state. Owing to the amplitude (voltage change) Vr of the reset gate pulse $\phi R$ and the parasitic capacitance C2 from the moment the charge detector 103 is in the floating state, reset feed-through noise is produced. That is, with regard to "OUTPUT WAVEFORM" at (d) in FIG. 6, the potential after the reset gate 104 is turned off, i.e., the potential with the charge detector 103 in the floating state, does not become the reset drain potential (reference potential) owing to the coupling capacitance of the parasitic capacitance C2 (see FIG. 4B) between the charge detector 103 and reset gate 104 but instead becomes a potential pulled down from the reset drain potential by an amount indicated by arrow (1) at (d) in FIG. 6 [this pulled-down potential is the feed-through level and is indicated by the dot-and-dash line pointed to by the arrow (1) at (d) in FIG. 6].

In order to suppress this reset feed-through noise according to Patent Document 1, the output gate pulse $\phi OG$ [see (b) in FIG. 6] applied to the output gate 102 (FIG. 4A) is made to undergo a change in voltage out of phase with the reset gate pulse $\phi R$ [see (a) in FIG. 6] applied to the reset gate 104 (FIG. 4A) and the reset feed-through noise is suppressed by the parasitic capacitance C1 and amplitude (voltage change) Vog of the output gate pulse $\phi OG$. At (d) in FIG. 6, arrow (2) pointing upward from the dot-and-dash line at the tip of arrow (1) indicates the amount of voltage-change suppression ascribable to the voltage change Vog of the output gate 102 and the coupling capacitance of the parasitic capacitance C1 of the output gate 102, and the potential of the charge detector 103 is pulled up by this amount of suppression of voltage change.

More specifically, with regard to "OUTPUT WAVEFORM" at (d) of FIG. 6, the reset feed-through level is the result obtained by pulling up the potential toward the side of the reset drain potential (the dashed line) by the amount (2) of change suppression, which is ascribable to the voltage change and the parasitic capacitance C1 of the output gate, from the level to which the potential fell from the reset drain potential by the amount (1) of change ascribable to the voltage change Vr and parasitic capacitance C2 of the reset gate.

[Patent Document 1] Japanese Patent Kokai Publication No. 5-20892

SUMMARY OF THE DISCLOSURE

The disclosures of Patent Document 1 are incorporated by reference in this specification. An analysis of the related art in the present invention is given below.

In the related art described with reference to FIGS. 4 to 5, the amplitude (voltage change) Vr of the reset gate changes after the charge detector 103 is in the floating state in a case where the potential of the N-type diffusion layer that forms the CCD register and charge detector 103 fluctuates owing to a variation in implantation of N-type impurity and push-down by thermal diffusion. FIG. 7B schematically illustrates the manner in which a variation develops in the amount of change in potential, after the charge detector 103 is in the floating state, ascribable to a variation in the potential of the N-type diffusion layer that forms the CCD register and charge detector 103.

When the potential of the N-type diffusion layer that forms the CCD register and charge detector 103 rises, the amplitude Vr of the reset gate after the charge detector 103 is in the floating state declines. When the potential of the N-type diffusion layer falls, the amplitude Vr of the reset gate after the charge detector 103 is in the floating state increases. As a consequence, the magnitude of reset feed-through noise produced by the amplitude Vr and parasitic capacitance C2 of the reset gate after the charge detector 103 is in the floating state also changes in similar fashion.

In the related art described above, however, the amplitude Vog of the output gate pulse φOG applied to the output gate 102 is constant. As a result, the effect of suppressing reset feed-through noise, which is controlled by the amplitude Vog and parasitic capacitance C1, is constant. That is, at (d) of FIG. 6, whereas the amount (1) of change after the floating state varies, the amount (2) of change suppression is fixed.

Accordingly, in the arrangement of the related art such as in Patent Document 1, the effect of suppressing reset feed-through noise is susceptible to a variation in the potential of the N-type diffusion layer and therefore the overall effect is limited. That is, recognition of the fact that reset feed-through noise varies is lacking in the related art such as described in Patent Document 1, and the situation is such that measures for dealing with this have not been taken.

When reset feed-through noise varies by a great amount, there is little operating-point design margin in cases where a high-speed/high-gain output circuit is used. As a result, design is difficult and this leads to a decline in product yield.

Further, in a case where the output signal from a CCD sensor is input to an A/D converting device or the like located downstream, a large amount of reset feed-through noise can lead to a decline in dynamic range.

Accordingly, in order to deal with the problems set forth above, it is preferred that reset feed-through noise be made as small as possible and suppressed stably without variation.

The present invention has been devised based upon recognition of the foregoing facts by the inventor and has the structure set forth below.

In accordance with a first aspect of the present invention, there is provided a CCD device in which a charge transfer register of a CCD structure is connected to a charge detector via an output gate and has a reset gate between the charge detector and a reset drain, wherein an output gate pulse opposite in phase from a reset pulse applied to the reset gate is applied to the output gate, the CCD device comprising: means for detecting potential of the charge detector; and an adjusting circuit (output gate pulse gain adjusting circuit) for controlling amplitude of the output gate pulse, which is applied to the output gate, based upon result of detection of the potential of the charge detector. The means for detecting the potential of the charge detector has a dummy charge detector equivalent to the charge detector.

In accordance with another aspect of the present invention, there is provided a method of driving a CCD device in which a charge transfer register of a CCD structure is connected to a charge detector 3 via an output gate 2 and has a reset gate 4 between the charge detector 3 and a reset drain region 5, the method comprising the steps of: applying an output gate pulse opposite in phase from a reset pulse, which is applied to the reset gate 4, to the output gate; detecting potential of the charge detector; and controlling amplitude of the output gate pulse, which is applied to the output gate, based upon result of detection of the potential of the charge detector.

In accordance with the present invention, reset feed-through noise can be suppressed regardless of a variation in the potential of a diffusion layer.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 4A and 4B are diagrams illustrating the configuration of related art;

FIG. 6 is a diagram illustrating timings and output waveform; and

PREFERRED MODES OF THE INVENTION

Figure 1:
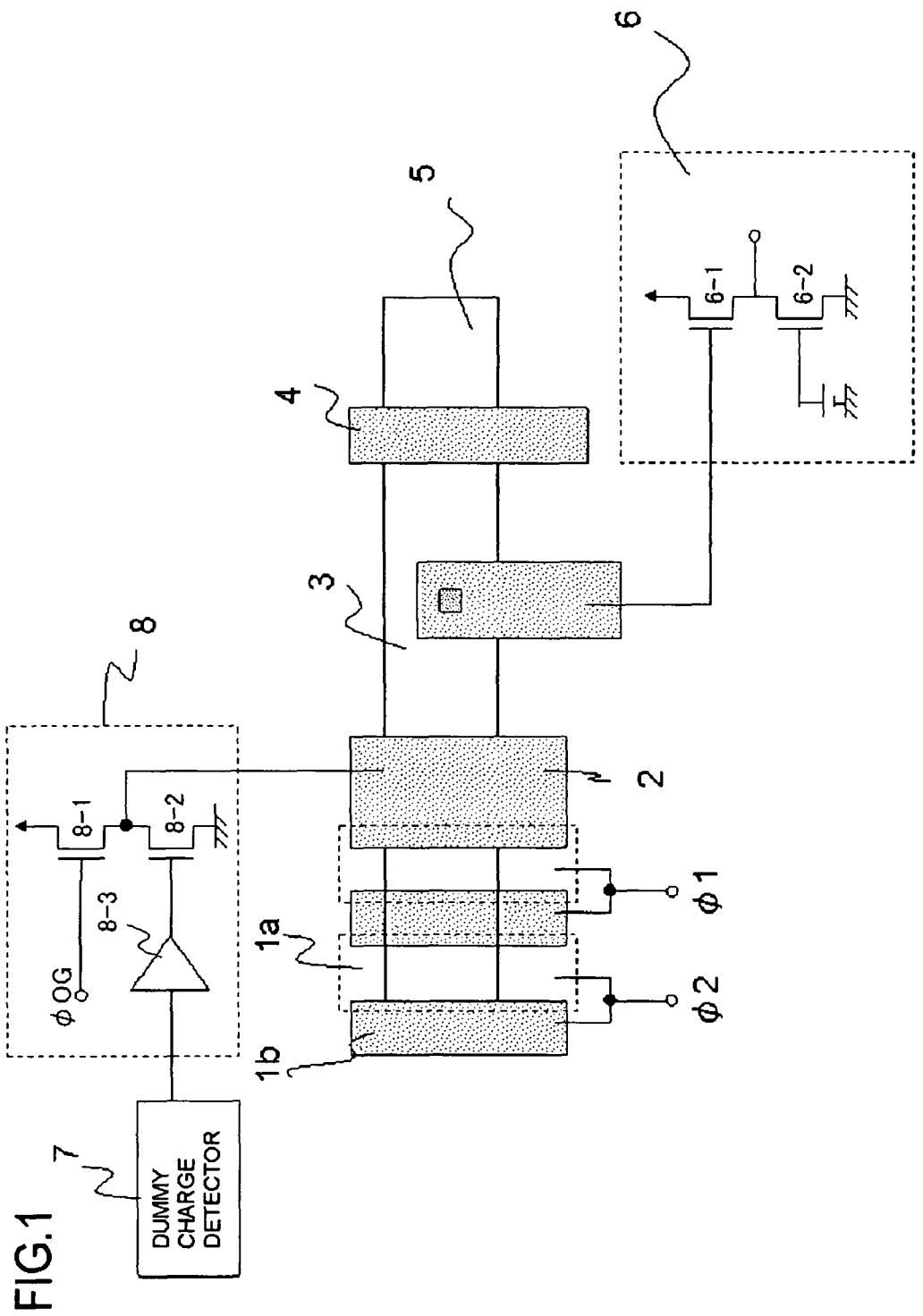
FIG. 1 is a diagram illustrating the configuration of a first embodiment of the present invention.

The present invention will be described in greater detail below with reference to the accompanying drawings. The invention provides a CCD device in which a charge transfer register of a CCD structure is connected to a charge detector (3) via an output gate (2) and has a reset gate (4) between the charge detector (3) and a reset drain (5), wherein an output gate pulse opposite in phase from a reset pulse applied to the reset gate (4) is applied to the output gate (2). The CCD device has an adjusting circuit (output gate pulse gain adjusting circuit) 8 for controlling amplitude of the output gate pulse, which is applied to the output gate (2), based upon result of detection of the potential of a diffusion layer in a dummy charge detector (7) constituting means for detecting the potential of the charge detector (3). The potential of an N-type diffusion layer in the charge detector (3) is detected by the dummy charge detector (7) and control is exercised to vary the amplitude of the output gate pulse in such a manner that the amplitude will follow up a variation in the potential of the N-type diffusion layer. As a result, the effectiveness of suppression of reset feed-through noise is improved. The adjusting circuit (8) receives the result of detection of the potential of the charge detector and adjusts gain in accordance with the value of potential of the charge detector, thereby controlling the amplitude of the output gate pulse and supplying it to the output gate (2). Exemplary embodiments of the invention will now be described.

FIG. 1 is a diagram illustrating the configuration of an exemplary embodiment of the present invention. Shown in FIG. 1 are first polysilicon layer 1a, second polysilicon layer 1b, an output gate 2, a charge detector 3, a reset gate 4, a reset drain (N+ region) 5, an output circuit (source-follower buffer) 6, a dummy charge detector 7 and an output gate pulse gain adjusting circuit 8. Driving pulses φ1 and φ2 of two phases are for transferring signal charge in the horizontal direction. The first polysilicon layer 1a and second polysilicon layer 1b driven by the two-phase driving pulses φ1, φ2 in FIG. 1 form the final stage of a CCD shift register.

In the case of the arrangement of FIG. 4A, the output gate pulse φOG is applied to the output gate 102. In this exemplary embodiment, however, the output gate pulse φOG is not applied directly to the output gate 2. Rather, as illustrated in FIG. 1, the dummy charge detector 7 is provided, the potential of the dummy charge detector 7 is extracted and is input to the output gate pulse gain adjusting circuit 8. The output gate pulse gain adjusting circuit 8 receives the output gate pulse φOG, adjusts the gain of the output gate pulse based upon the potential of the dummy charge detector 7 and applies the result to the output gate 2.

The output gate pulse gain adjusting circuit 8 controls the amplitude Vog (see amplitude Vog of the output gate pulse φOG in FIG. 6) of the output gate pulse φOG in such a manner that the amplitude will follow up amplitude Vr (see amplitude Vr of the reset gain pulse φR in FIG. 6) of the reset gate 4 that prevails after the charge detector 3 has been in the floating state. Although there is no particular limitation imposed on the present invention, the output gate pulse gain adjusting circuit 8 in this exemplary embodiment includes a buffer amplifier 8-3 for receiving the output voltage of the dummy charge detector 7, a transistor (NMOSFET) 8-1 constituting a source-follower circuit, and a load transistor (NMOSFET) 8-2. The output of the buffer amplifier 8-3 is connected to the gate of the load transistor 8-2 of the source follower, and the gain of the source follower is varied in accordance with the output voltage of the dummy charge detector 7. It should be noted that as long as the output gate pulse gain adjusting circuit 8 is a circuit that performs an equivalent functional operation, there is of course no limitation upon the structure thereof.

Figure 2:
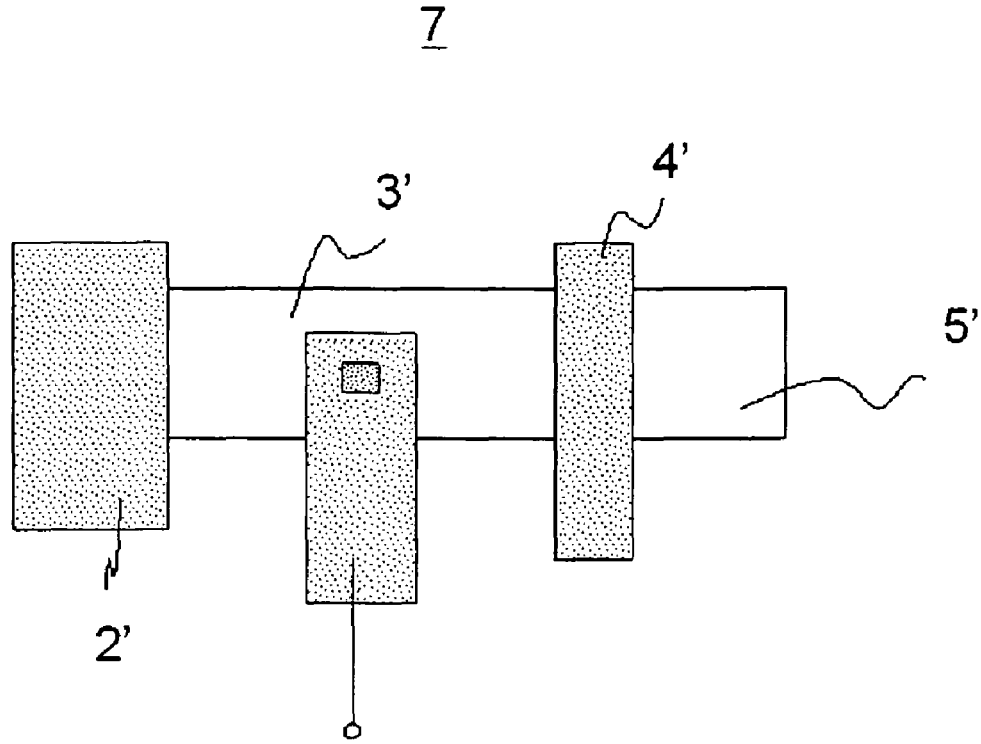
FIG. 2 is a diagram illustrating the configuration of a dummy charge detector according to the first embodiment.

FIG. 2 is a diagram illustrating an example of the configuration (layout) of the dummy charge detector 7. In this example, the layout of the dummy charge detector 7 is the same as that of the charge detector 3. Specifically, the dummy charge detector 7 has an output gate 2', a charge detector 3', a reset gate 4' and a reset drain 5'. In the dummy charge detector 7 of FIG. 2, a terminal led out from the charge detector 3' is connected to the output gate pulse gain adjusting circuit 8 of FIG. 1 in such a manner that the output of the charge detector 3 of FIG. 1 is connected to the output circuit 6. In the dummy charge detector 7 of FIG. 2, the reset gate pulse φR (see FIG. 6) is not applied to the reset gate 4'. For example, a voltage equal to the low level of the reset gate pulse φR is applied. The output gate pulse φOG (see FIG. 6) is not applied to the output gate 2'. For example, a voltage equal to the high level of the output gate pulse φOG is applied. Under these conditions, the potential of the N-type diffusion layer is detected. It should be noted that since the dummy charge detector 7 is a circuit for monitoring the potential of the N-type diffusion layer, the output gate 2' need not be connected to the final stage of the CCD shift register (driven by the two-phase drive clocks φ1 and φ2).

When the potential of the N-type diffusion layer constituting the CCD shift register and charge detector 3 rises, the amplitude Vr of the reset gate after the charge detector 3 has been in the floating state declines and reset feed-through noise produced by the amplitude Vr and parasitic capacitance C2 of the reset gate after the charge detector 3 has been in the floating state also declines. That is, (1) shown at (a) in FIG. 6 decreases and the output waveform [the potential indicated by the dot-and-dash line at (d) of FIG. 6] of the charge detector 3 approaches the reset drain potential (the output voltage of the charge detector 3 rises). Accordingly, the voltage that has been extracted from the dummy charge detector 7 also changes in an increasing direction.

Figure 3:
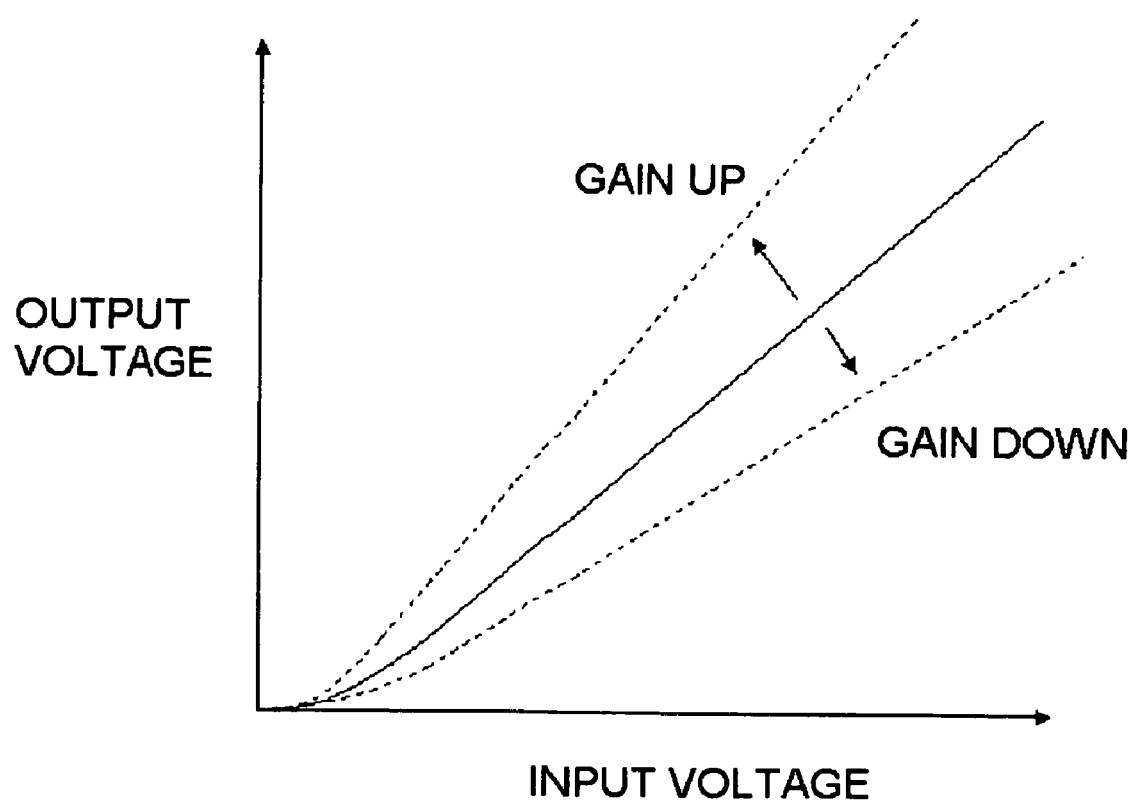
FIG. 3 is a diagram illustrating an example of an input/output characteristic of a φOg pulse gain adjusting circuit.
Figure 5A:
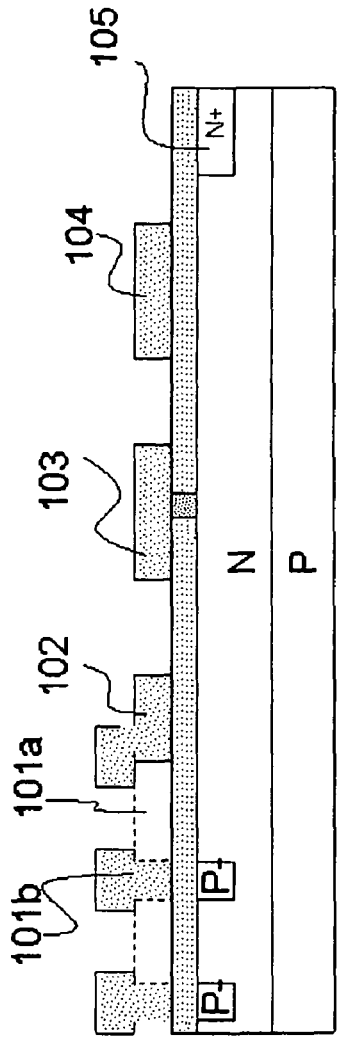
FIGS. 5A and 5B are diagrams illustrating the cross-sectional configuration and potentials of the related art.
Figure 5B:
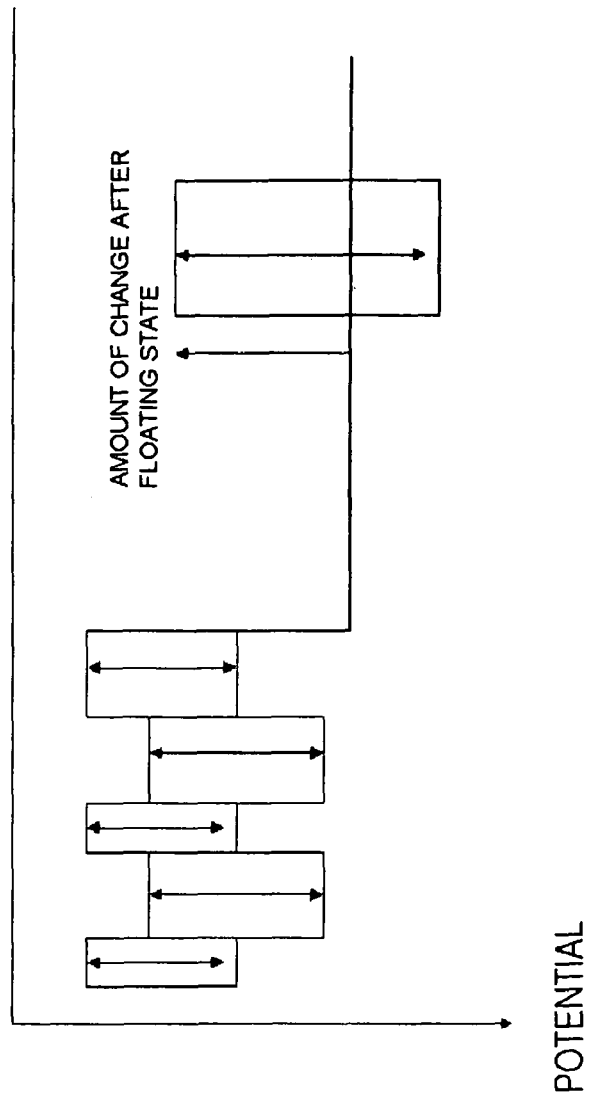
Figure 7A:
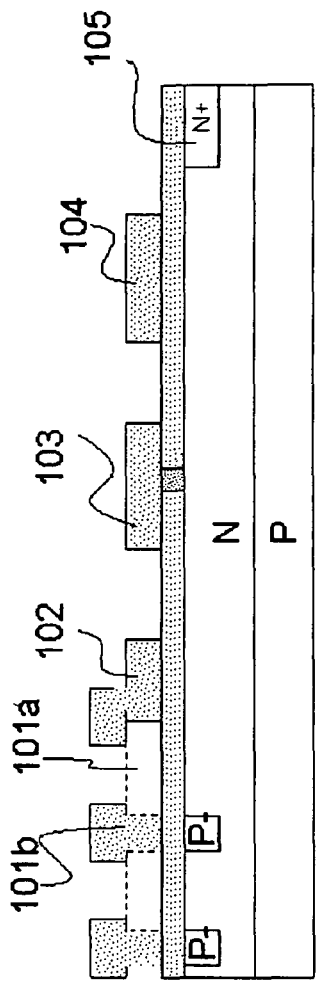
FIGS. 7A and 7B are diagrams of reference cases useful in describing the cross-sectional configuration and conditions when there is a variation in the potential of an N-type diffusion layer.
Figure 7B:
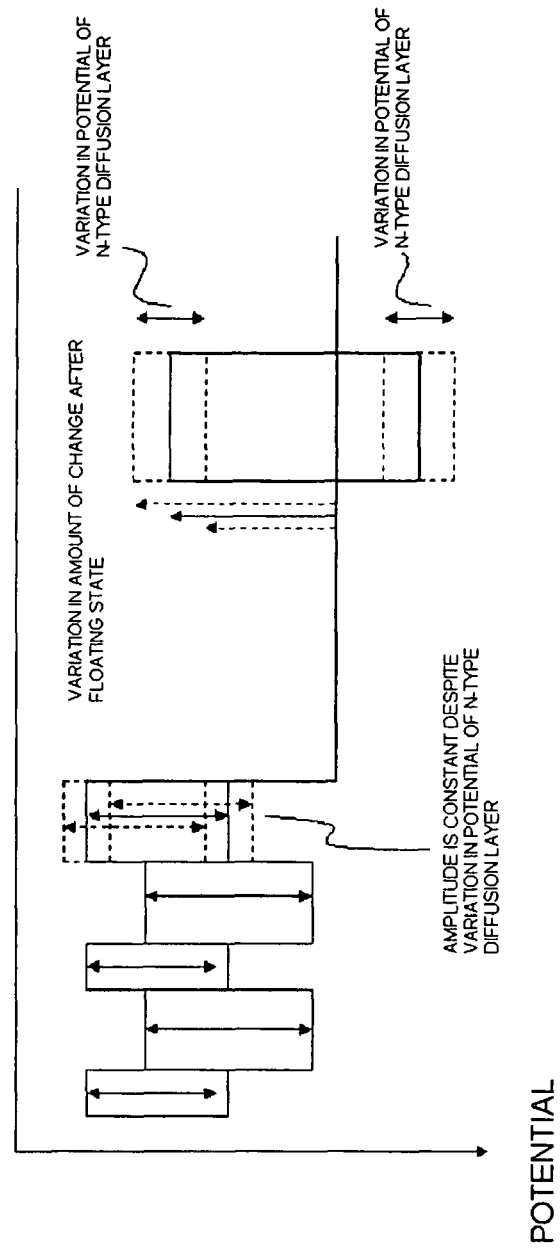

The output extracted from the dummy charge detector 7 is applied via the buffer amplifier 8-3 to the gate of the transistor 8-2 that forms the load of the source-follower circuit. As a result, as will be understood from the change in the input/output characteristic of the source follower illustrated in FIG. 3, the gain of the source follower is lowered and the amplitude of the output gate pulse φOG (the phase of which is opposite that of the reset gate pulse φR) is reduced. The pulse of the reduced amplitude is applied to the output gate 2.

In a case where the potential of the N-type diffusion layer changes in a decreasing direction, the voltage change (amplitude) Vr of the reset gate 4 after the charge detector 3 has been in the floating state increases and reset feed-through noise produced by the voltage change (amplitude) Vr and parasitic capacitance C2 of the reset gate after the charge detector 3 has been in the floating state also increases. That is, (1) shown at (d) in FIG. 6 increases and the output waveform [the potential indicated by the dot-and-dash line at (d) of FIG. 6] of the charge detector 3 departs from the reset drain potential (the output voltage of the charge detector 3 falls). Accordingly, the voltage that has been extracted from the dummy charge detector 7 also changes in a decreasing direction. In this case, this exemplary embodiment is such that the voltage extracted from the dummy charge detector 7 is input to the gate of the load transistor 8-2 of the source-follower circuit. As a result, the gain of the source follower is raised and the amplitude of the output gate pulse φOG is increased. The pulse of the increased amplitude is applied to the output gate 2. In this case, (2) at (d) in FIG. 6 increases. It should be noted that when the bias voltage of the load transistor 8-2 (the output voltage of the buffer amplifier 8-3) in the source-follower buffer (8-1, 8-2) of FIG. 1 falls, the ON resistance of the source-grounded load transistor 8-2 rises and the gain of the output voltage of the source follower (the source voltage of the transistor 8-1) with respect to the input voltage rises. When the bias voltage (the output voltage of the buffer 8-3) rises, the ON resistance of the load transistor 8-2 falls and the output voltage of the source follower (the source voltage of the transistor 8-1) with respect to the input voltage falls ("GAIN DOWN" in FIG. 3).

Thus, as described above, the potential of the N-type diffusion layer constituting the charge detector 3 is detected and the amplitude of the output gate pulse φOG is controlled so as to follow up the amplitude of the reset gate pulse φR that prevails after the charge detector 3 is in the floating state, thereby making it possible to suppress reset feed-through noise. That is, with regard to the output waveform of the charge detector 3 at (d) in FIG. 6, control is exercised to vary the amount (2) of change suppression, which is ascribable to the voltage change (Vog) and parasitic capacitance (C1) of the output gate, so as to follow up the amount (1) of change ascribable to the voltage change (Vr) and the parasitic capacitance (C2) of the reset gate that prevail after the charge detector 3 is in the floating state, thereby making it possible to suppress reset feed-through noise.

It should be noted that the present invention is not limited to the simple circuit arrangement shown in FIG. 1 and is applicable to all circuit arrangements that detect the potential of a charge detector and control the amplitude of the output gate pulse φOG using the result of detection.

Though the present invention has been described in accordance with the foregoing embodiments, the invention is not limited to these embodiments and it goes without saying that the invention covers various modifications and changes that would be obvious to those skilled in the art within the scope of the claims.

What is claimed is:

1. A CCD device comprising:
    a charge transfer register of a CCD structure;
    an output gate;
    a charge detector, to which the charge transfer register is connected via the output gate;
    a reset gate arranged between the charge detector and a reset drain,
    an output gate pulse opposite in phase from a reset pulse applied to the reset gate being applied to the output gate,
    a detector unit that detects potential of the charge detector; and
    an adjusting circuit that controls amplitude of the output gate pulse, which is applied to the output gate, based upon result of detection of the potential of the charge detector.

2. The device according to claim 1, wherein the detector unit includes a dummy charge detector equivalent to the charge detector.

3. The device according to claim 1, wherein the adjusting circuit receives the result of detection of potential of the charge detector and adjusts gain in accordance with the value of potential of the charge detector, the adjusting circuit controlling the amplitude of the output gate pulse, and supplying the pulse of the controlled amplitude to the output gate.

4. The device according to claim 2, wherein the adjusting circuit includes:
    a first transistor configured as a follower to produce a voltage that follows an input voltage; and
    a second transistor constituting a follower load,
    the first transistor receiving the output gate pulse,
    a bias voltage, which conforms to the potential detected by the dummy charge detector, being applied to the second transistor.

5. The device according to claim 1, wherein when potential of a diffusion layer of the charge detector varies in an increasing direction and the amplitude of the reset gate after the charge detector is in a floating state decreases, the adjusting circuit decreases the amplitude of the output gate pulse; and
    when the potential of the diffusion layer of the charge detector varies in a decreasing direction and the amplitude of the reset gate after the charge detector is in the floating state increases, the adjusting circuit increases the amplitude of the output gate pulse.

6. A method of driving a CCD device in which a charge transfer register of a CCD structure is connected to a charge detector via an output gate and has a reset gate between the charge detector and a reset drain, the method comprising:
    applying an output gate pulse opposite in phase from a reset pulse, which is applied to the reset gate, to the output gate;
    detecting potential of the charge detector; and
    controlling amplitude of the output gate pulse based upon result of detection of the potential of the charge detector.

7. The method according to claim 6, comprising detecting, by a dummy charge detector equivalent to the charge detector, the potential of the charge detector.

8. The method according to claim 6, further comprising:
    responsive to result of detection of the potential of the charge detector, adjusting gain in accordance with the value of potential of the charge detector to control the amplitude of the output gate pulse; and
    supplying the pulse of the controlled amplitude to the output gate.

9. The method according to claim 6, further comprising:
    decreasing the amplitude of the output gate pulse, when potential of a diffusion layer of the charge detector varies in an increasing direction and the amplitude of the reset gate after the charge detector is in a floating state decreases; and
    increasing the amplitude of the output gate pulse, when the potential of the diffusion layer of the charge detector varies in a decreasing direction and the amplitude of the reset gate after the charge detector is in the floating state increases.

* * * * *